(12) United States Patent
Yang

(10) Patent No.: US 10,930,878 B2
(45) Date of Patent: Feb. 23, 2021

(54) ORGANIC LIGHT-EMITTING DIODE (OLED) PACKAGE STRUCTURE, AND OLED DISPLAY PANEL AND A METHOD FOR MANUFACTURING THE SAME

(71) Applicant: Wuhan China Star Optoelectronics Semiconductor Display Technology Co., Ltd., Wuhan (CN)

(72) Inventor: Qi Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 29 days.

(21) Appl. No.: 16/339,010

(22) PCT Filed: Oct. 10, 2018

(86) PCT No.: PCT/CN2018/109713
§ 371 (c)(1),
(2) Date: Apr. 3, 2019

(87) PCT Pub. No.: WO2020/006920
PCT Pub. Date: Jan. 9, 2020

(65) Prior Publication Data
US 2020/0144534 A1    May 7, 2020

(51) Int. Cl.
*H01L 51/52*  (2006.01)
*H01L 51/56*  (2006.01)

(52) U.S. Cl.
CPC ...... *H01L 51/5237* (2013.01); *H01L 51/5293* (2013.01); *H01L 51/56* (2013.01)

(58) Field of Classification Search
CPC ............ H01L 51/5237; H01L 51/5256; H01L 51/5281; H01L 51/5293; H01L 51/56; H01L 51/50; H01L 27/3244
See application file for complete search history.

(56) References Cited

U.S. PATENT DOCUMENTS

| 6,624,863 | B1 | 9/2003 | Jacobs et al. |
| 8,368,299 | B2 * | 2/2013 | Kim ..................... H01L 51/5281 313/506 |
| 9,835,770 | B2 * | 12/2017 | Kim ..................... G02B 5/3033 |
| 10,234,602 | B2 * | 3/2019 | Kim ........................ G02B 1/18 |

(Continued)

FOREIGN PATENT DOCUMENTS

| CN | 104319282 | 1/2015 |
| CN | 105762173 | 7/2016 |

(Continued)

OTHER PUBLICATIONS

Written Opinion in PCT/CN2020/109713 (Year: 2018).*

*Primary Examiner* — Mary A Wilczewski

(57) ABSTRACT

An organic light-emitting diode (OLED) package structure, and an OLED display panel and a method for manufacturing same are provided. The OLED package structure includes a packaging unit and a polarizing layer. The packaging unit includes a first packaging layer, a second packaging layer, and a protective layer. The polarizing layer includes a first sub polarizing layer and a second sub polarizing layer. The first sub polarizing layer is disposed between an OLED substrate and the first packaging layer, and the second sub polarizing layer is disposed between the first packaging layer and the second packaging layer.

16 Claims, 7 Drawing Sheets

(56) References Cited

U.S. PATENT DOCUMENTS

| | | | | |
|---|---|---|---|---|
| 2007/0165165 A1* | 7/2007 | Joten | ................. | G02F 1/133555 |
| | | | | 349/119 |
| 2007/0177086 A1* | 8/2007 | Ishitani | ............... | H01L 51/5281 |
| | | | | 349/117 |
| 2007/0211336 A1* | 9/2007 | Michihata | ............. | G02B 5/305 |
| | | | | 359/487.05 |
| 2013/0140587 A1* | 6/2013 | Lim | .................... | H01L 51/5281 |
| | | | | 257/88 |
| 2014/0319490 A1* | 10/2014 | Kim | .................... | G02B 5/3033 |
| | | | | 257/40 |
| 2016/0170110 A1* | 6/2016 | Pau | ...................... | G02B 5/3016 |
| | | | | 356/364 |
| 2016/0329527 A1 | 11/2016 | Yang et al. | | |
| 2018/0081089 A1* | 3/2018 | Kim | .................... | G02B 5/3033 |
| 2019/0204477 A1* | 7/2019 | Kim | ...................... | G02B 1/105 |
| 2019/0390076 A1* | 12/2019 | Isonaka | .................. | C09D 11/10 |
| 2020/0144534 A1* | 5/2020 | Yang | .................. | H01L 51/5281 |

FOREIGN PATENT DOCUMENTS

| | | | | |
|---|---|---|---|---|
| CN | 106373986 | | 2/2017 | |
| CN | 107144911 | | 9/2017 | |
| CN | 107978689 | | 5/2018 | |
| EP | 0887692 | | 12/1998 | |
| WO | WO 2020/006920 | * | 1/2020 | ............. H01L 51/50 |

* cited by examiner

ORGANIC LIGHT-EMITTING DIODE (OLED) PACKAGE STRUCTURE, AND OLED DISPLAY PANEL AND A METHOD FOR MANUFACTURING THE SAME

RELATED APPLICATIONS

This application is a National Phase of PCT Patent Application No. PCT/CN2018/109713 having International filing date of Oct. 10, 2018, which claims the benefit of priority of Chinese Patent Application No. 201810729087.4 filed on Jul. 5, 2018. The contents of the above applications are all incorporated by reference as if fully set forth herein in their entirety.

FIELD AND BACKGROUND OF THE INVENTION

The present disclosure relates to the display field, and specifically to an organic light-emitting diode (OLED) package structure, and an OLED display panel and a method for manufacturing the same.

BACKGROUND OF INVENTION

Self-illumination of an organic light-emitting diode (OLED) display panel during display is easily interfered by ambient light. To effectively resist the interference of the ambient light to the self-illumination of the OLED display panel, a circular polarizer is attached to a module of the OLED display panel. Emission of the ambient light is reduced in combination with a linear polarizer and a ¼ wavelength phase film, thereby improving display contrast of the OLED display panel.

Referring to FIG. 1, an OLED display panel sequentially includes a base 11, an array substrate 12, an OLED light-emitting layer 13, a packaging film 14, a touch panel 15, a circular polarizer 16, an optical clear adhesive 17, and a cover 18. The circular polarizer 16 is positioned between the touch panel 15 and the optical clear adhesive 17.

FIG. 2 illustrates a specific structure of the circular polarizer. The OLED display panel sequentially includes a release film 121, a phase retarder 162, an adhesive 163, a protective film 164, a polarizing matrix 165, a protective film 164, and a surface protective film 166 that are stacked. Stretching is performed after dyeing using dichroic organic dyestuff, to form a polarization function. A protective film 164 is attached to each of upper and lower sides of the polarizing matrix 165. The protective film 164 is formed using a triacetate (TAC) material having high strength, good transmittance, and good damp heat resistance. A circular polarization function is implemented by the phase retarder 162. Linear polarization is converted into circular polarization through ¼ wavelength phase retardation.

It is time-consuming to attach the current polarizer 16, and it is difficult to lighten and thin the polarizer 16. Therefore, how to make a polarizer ultra-thin and even cancel the polarizer is a big challenge.

SUMMARY OF THE INVENTION

The present disclosure provides an OLED package structure, and an organic light-emitting diode (OLED) display panel and a method for manufacturing the same, to resolve a problem that it is time-consuming to attach a polarizer in the current OLED display panel, and it is difficult to thin the polarizer.

According to an aspect of the present disclosure, an OLED package structure is provided. The OLED package structure includes a packaging unit and a polarizing layer disposed in the packaging unit.

The packaging unit includes a first packaging layer, a second packaging layer, and a protective layer.

The polarizing layer includes a first sub polarizing layer and a second sub polarizing layer.

The first sub polarizing layer is disposed between an OLED substrate and the first packaging layer, and the second sub polarizing layer is disposed between the first packaging layer and the second packaging layer.

According to an embodiment of the present disclosure, each of the first sub polarizing layer and the second sub polarizing layer includes an organic photosensitive layer and a dye molecule layer that are stacked.

The first sub polarizing layer is opposite to and parallel to the second sub polarizing layer.

According to an embodiment of the present disclosure, the organic photosensitive layer is formed using a photo-alignable organic material.

According to an embodiment of the present disclosure, the dye molecule layer is formed using a dichroic dye molecule material.

According to an embodiment of the present disclosure, the first sub polarizing layer is a ¼ wavelength phase retardation layer, and the second sub polarizing layer is a linear polarizing layer.

An angle between projection patterns of a transmission axis of the linear polarizing layer and a fast axis of the ¼ wavelength phase retardation layer on a same projection plane is 45°.

According to another aspect of the present invention, a method for manufacturing an OLED display panel is provided. The method includes:

step S10: providing an OLED substrate, and forming a first sub polarizing layer above the OLED substrate;

step S20: forming a first packaging layer above the first sub polarizing layer;

step S30: forming a second sub polarizing layer above the first packaging layer;

step S40: forming a second packaging layer above the second sub polarizing layer; and step S50: forming a protective layer above the second packaging layer.

Each of the first sub polarizing layer and the second sub polarizing layer includes an organic photosensitive layer and a dye molecule layer that are stacked.

According to an embodiment of the present disclosure, the first packaging layer and the second packaging layer are inorganic layers, and the protective layer is an organic layer.

According to an embodiment of the present disclosure, the step S10 specifically includes: providing an OLED substrate, forming the organic photosensitive layer on the OLED substrate, forming the dye molecule layer on a surface of the organic photosensitive layer, and performing a photo-alignment process to the organic photosensitive layer and the dye molecule layer, to form the first sub polarizing layer.

According to an embodiment of the present disclosure, the organic layer, the organic photosensitive layer, and the dye molecule layer are all formed using a thin film technology.

According to an embodiment of the present disclosure, the first sub polarizing layer is opposite to and parallel to the second sub polarizing layer.

According to an embodiment of the present disclosure, the organic photosensitive layer is formed using a photo-alignable organic material.

According to an embodiment of the present disclosure, the dye molecule layer is formed using a dichroic dye molecule material.

According to an embodiment of the present disclosure, the first sub polarizing layer is a ¼ wavelength phase retardation layer, and the second sub polarizing layer is a linear polarizing layer.

An angle between projection patterns of a transmission axis of the linear polarizing layer and a fast axis of the ¼ wavelength phase retardation layer on a same projection plane is 45°.

According to an embodiment of the present disclosure, the OLED display panel further includes at least one composite layer, and the composite layer includes an organic layer and an inorganic layer that are stacked.

The composite layer is disposed between the OLED substrate and the protective layer.

According to still another aspect of the present invention, an OLED display panel is provided. The OLED display panel includes an OLED substrate, a packaging unit disposed on the OLED substrate, and a polarizing layer disposed in the packaging unit.

The packaging unit includes a first packaging layer, a second packaging layer, and a protective layer;

The polarizing layer includes a first sub polarizing layer and a second sub polarizing layer.

The first sub polarizing layer is disposed between the OLED substrate and the first packaging layer, and the second sub polarizing layer is disposed between the first packaging layer and the second packaging layer.

According to an embodiment of the present disclosure, the first sub polarizing layer is opposite to and parallel to the second sub polarizing layer.

Each of the first sub polarizing layer and the second sub polarizing layer includes an organic photosensitive layer and a dye molecule layer that are stacked.

According to an embodiment of the present disclosure, the organic photosensitive layer is formed using a photo-alignable organic material.

According to an embodiment of the present disclosure, the dye molecule layer is formed using a dichroic dye molecule material.

According to an embodiment of the present disclosure, the first sub polarizing layer is a ¼ wavelength phase retardation layer, and the second sub polarizing layer is a linear polarizing layer.

An angle between projection patterns of a transmission axis of the linear polarizing layer and a fast axis of the ¼ wavelength phase retardation layer on a same projection plane is 45°.

According to an embodiment of the present disclosure, the OLED display panel further includes at least one composite layer, and the composite layer includes an organic layer and an inorganic layer that are stacked.

The composite layer is disposed between the OLED substrate and the protective layer.

In the present disclosure, an OLED package structure having a polarizing property is designed, such that a polarizing layer is compatible with a packaging unit, and on the premise that a process of attaching a circular polarizer is omitted, manufacturing and attachment of the polarizing layer can be simplified, and the polarizing layer can be ultra-thin.

BRIEF DESCRIPTION OF THE SEVERAL VIEWS OF THE DRAWINGS

To describe the technical solutions in the embodiments or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION OF PREFERRED SPECIFIC EMBODIMENTS OF THE INVENTION

The following embodiments are described with reference to the accompanying drawings, and are used to exemplify specific embodiments for implementation of the present disclosure. Terms about directions mentioned in the present disclosure, such as "on", "below", "front", "back", "left", "right", "in", "out", and "side surface" merely refer to directions in the accompanying drawings. Therefore, the used terms about directions are used to describe and understand the present disclosure, and are not intended to limit the present disclosure. In the figures, units having similar structures are represented using a same reference number.

The present disclosure provides an organic light-emitting diode (OLED) package structure, and an OLED display panel and a method for manufacturing the same. In view of a problem that it is time-consuming to attach a polarizer in the current OLED display panel, and it is difficult to thin the polarizer, embodiments can overcome the disadvantage.

The present disclosure is further described below with reference to the accompanying drawings and specific embodiments.

Figure 1:
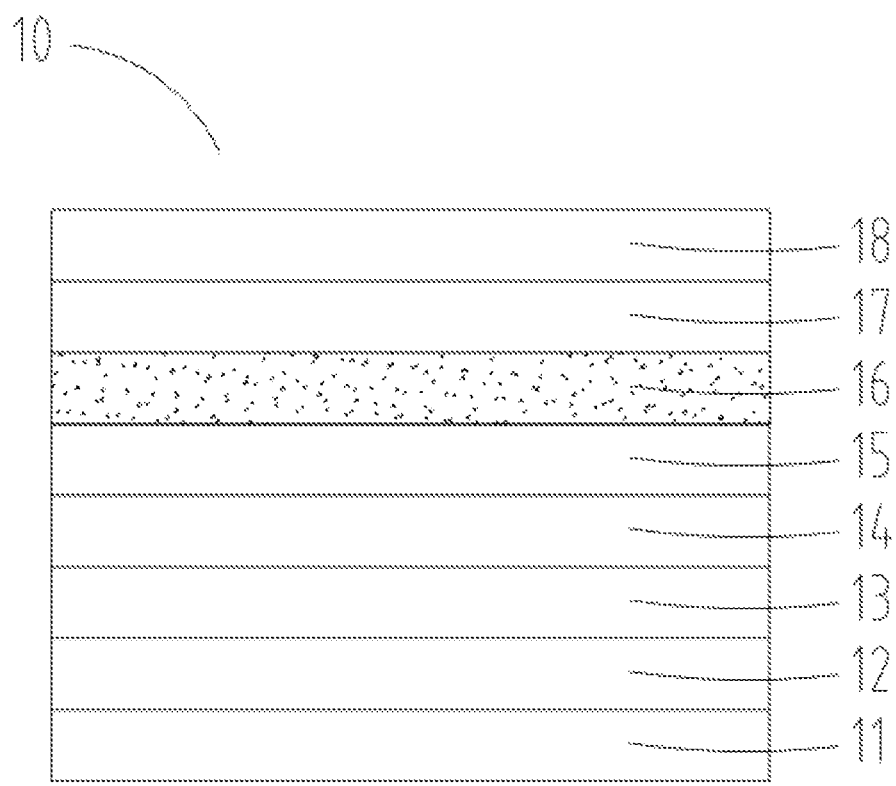
FIG. 1 is a schematic diagram of a structure of an organic light-emitting diode (OLED) display panel in the prior art.
Figure 2:
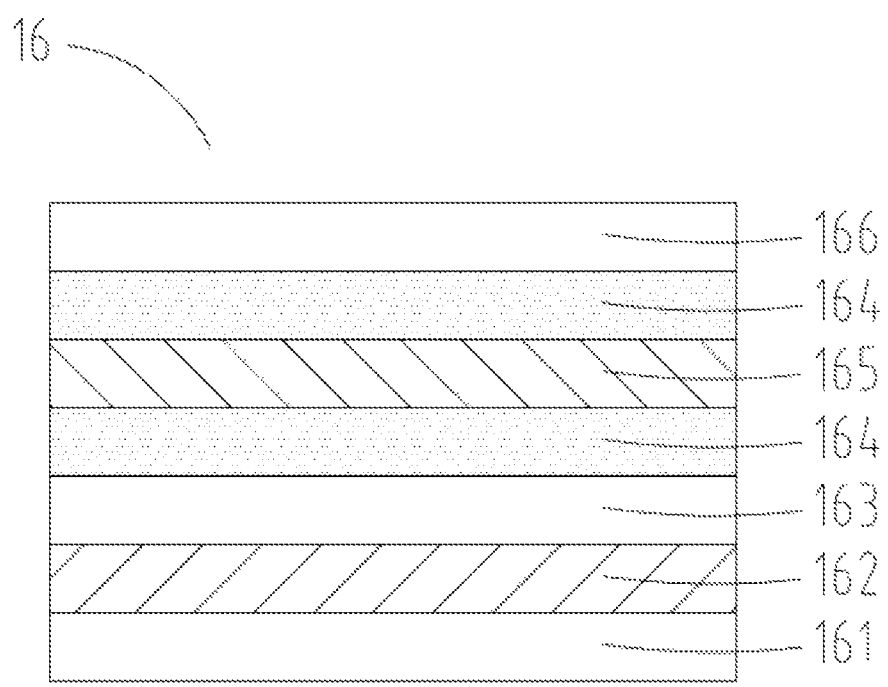
FIG. 2 is a schematic diagram of a structure of a circular polarizer in the prior art.
Figure 3:
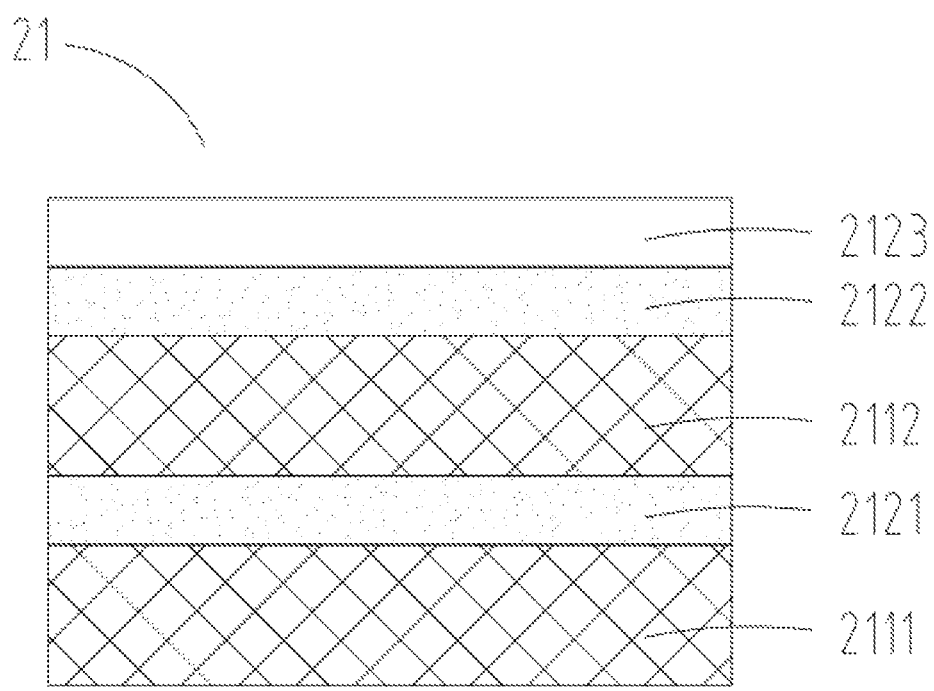
FIG. 3 is a schematic diagram of a structure of an OLED package structure according to an embodiment of the present disclosure.

FIG. 3 is a schematic diagram of a structure of an OLED package structure according to an embodiment of the present disclosure.

The embodiment of the present disclosure provides an OLED package structure 21 including a packaging unit 212 and a polarizing layer 211 disposed in the packaging unit.

The packaging unit includes a first packaging layer 2121, a second packaging layer 2122, and a protective layer 2123.

Generally, the first packaging layer 2121 and the second packaging layer 2122 are inorganic layers, and the protective layer is an organic layer.

In an embodiment, the inorganic layer has relatively good performance of blocking water and oxygen. Therefore, the inorganic layer in the OLED package structure is configured to block external water and oxygen.

The polarizing layer 211 includes a first sub polarizing layer 2111 and a second sub polarizing layer 2112.

In an embodiment, the first sub polarizing layer 2111 is disposed between an OLED substrate and the first packaging layer 2121, and the second sub polarizing layer 2112 is disposed between the first packaging layer 2121 and the second packaging layer 2122.

In an embodiment, the OLED package structure 21 is disposed above the OLED substrate.

Figure 4:
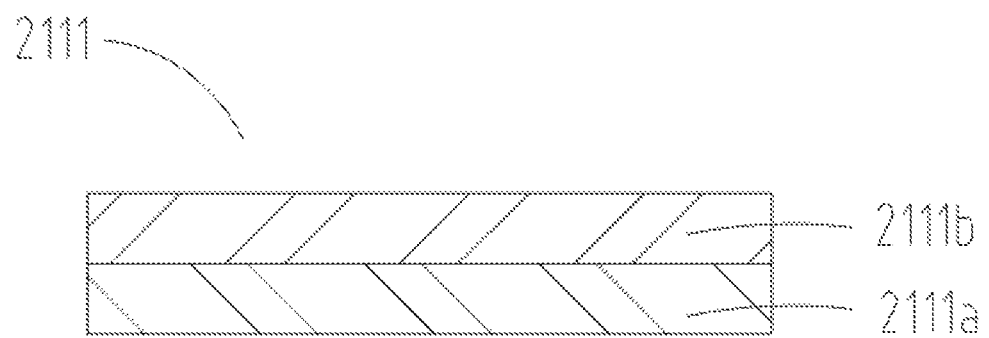
FIG. 4 is a schematic diagram of a structure of a first sub polarizer in an OLED package structure according to an embodiment of the present disclosure.

FIG. 4 is a schematic diagram of a structure of a first sub polarizer in an OLED package structure according to an embodiment of the present disclosure.

Figure 5:
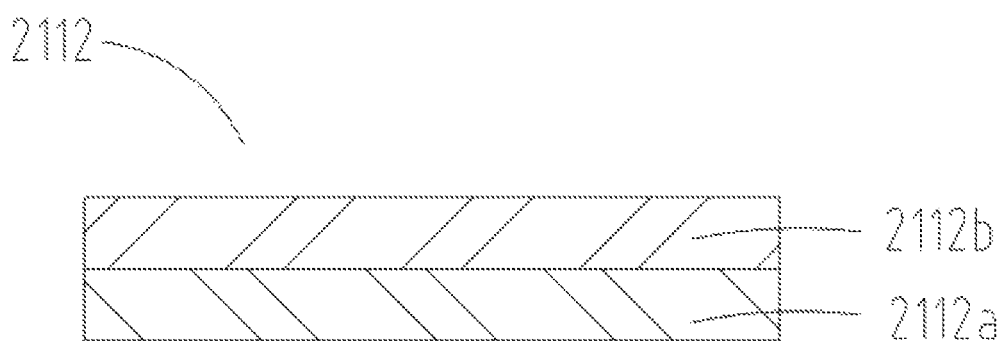
FIG. 5 is a schematic diagram of a structure of a second sub polarizer in an OLED package structure according to an embodiment of the present disclosure.

FIG. 5 is a schematic diagram of a structure of a second sub polarizer in an OLED package structure according to an embodiment of the present disclosure.

In an embodiment, the first sub polarizing layer 2111 includes an organic photosensitive layer 2111a and a dye molecule layer 2111b that are stacked. The second sub polarizing layer 2112 includes an organic photosensitive layer 2112a and a dye molecule layer 2112b that are stacked.

To be specific, the first sub polarizing layer 2111 and the second sub polarizing layer 2112 have a same structure, but have different functions in the package structure.

During preparation of the organic photosensitive layer 2112a and the dye molecule layer 2112b, a photo-alignment process requires to be performed on an organic photosensitive material and a dye molecule material, to respectively form the organic photosensitive layer 2112a and the dye molecule layer 2112b.

In an embodiment, the organic photosensitive layer is formed using a photo-alignable organic material.

In an embodiment, the dye molecule layer is formed using a dichroic dye molecule material.

The first sub polarizing layer 2111 is opposite to and parallel to the second sub polarizing layer 2112.

In the present disclosure, an original circular polarizer is replaced by the organic photosensitive layer and the dye molecule layer, and a conventional polarizing matrix stretching process is replaced by the photo-alignment process.

In an embodiment, after the dye molecule layer is adsorbed by the organic photosensitive layer, dye molecules are arranged in a particular direction through photo-alignment, to form conductive long chains. Electrons having conductivity in the dye molecules can move along the long chains. During exposure to light, an electric vector vibration of an optical wave along a direction of the long chain is strongly adsorbed, and an electric vector vibration perpendicular to the direction of the long chain is not adsorbed and the optical wave can pass. In this way, transmission light forms polarized light.

In an embodiment, the first sub polarizing layer 2111 is a ¼ wavelength phase retardation layer, and the second sub polarizing layer 2112 is a linear polarizing layer.

In an embodiment, an angle between projection patterns of a transmission axis of the linear polarizing layer and a fast axis of the ¼ wavelength phase retardation layer on a same projection plane is 45°.

Figure 6:
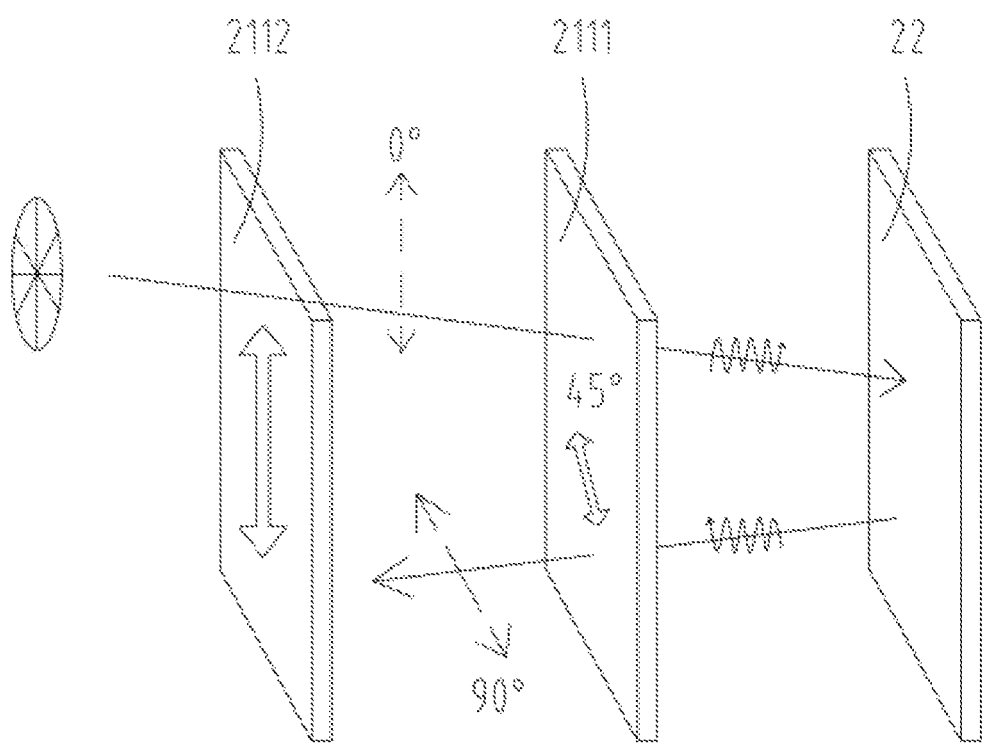
FIG. 6 is a schematic diagram of a structure of a polarization principle of an OLED package structure according to an embodiment of the present disclosure.

For a schematic diagram of polarization principle of the OLED package structure, refer to FIG. 6.

It is assumed that, the transmission axis of the linear polarizing layer is in a direction of 0°, and the fast axis of the ¼ wavelength phase retardation layer is in a direction of 45°. After external light arrives at the OLED package structure, the light first passes through the linear polarizing layer and the phase retardation layer and then is converted into left-handed circular polarized light. After the light is reflected by a high reflection interface of the OLED substrate, right-handed circular polarized light is formed, and after the light passes through the phase retardation layer again, the light is converted into light of 90°. In this way, the light is perpendicular to a transmission direction of the linear polarizing layer and cannot be emitted, thereby achieving an effect of reducing interference from ambient light and improving contrast.

In an embodiment, the OLED package structure further includes at least one composite layer, and the composite layer includes an organic layer and an inorganic layer that are stacked.

In an embodiment, the composite layer is disposed between the OLED substrate and the protective layer. Based on a manner of adding the composite layer, an effect of blocking water and oxygen by the OLED package structure can be improved.

Figure 7:
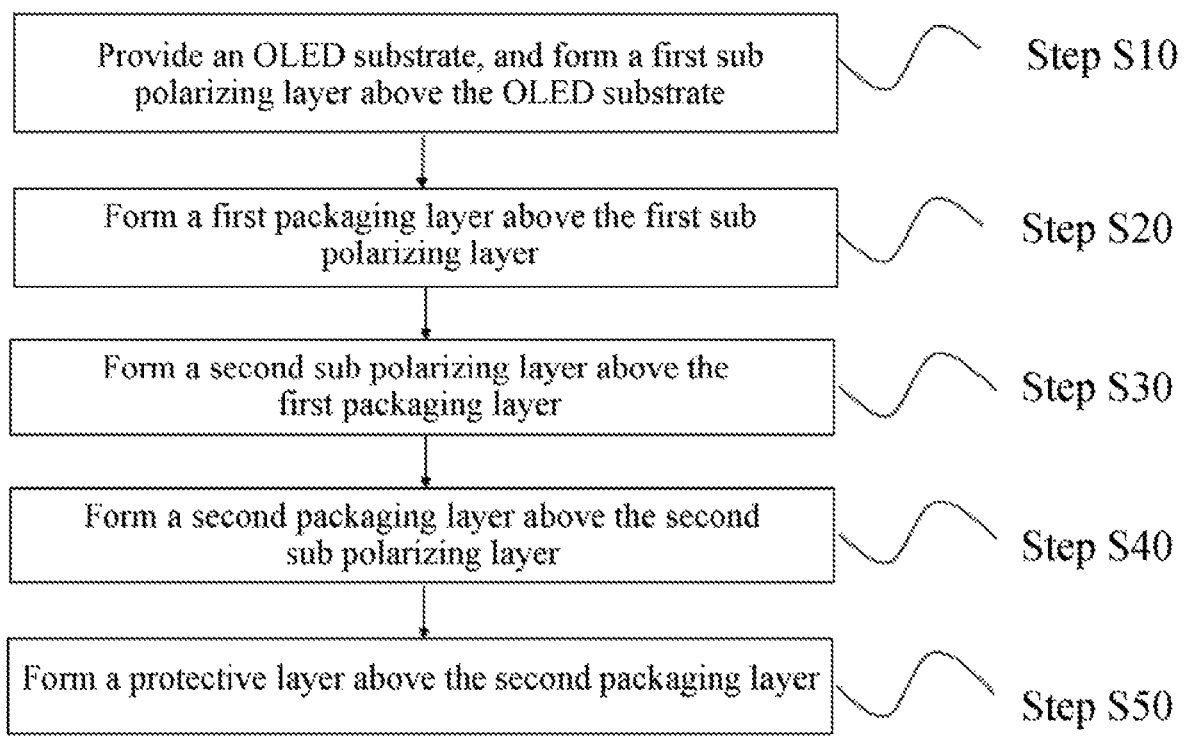
FIG. 7 is a schematic flowchart of a method for manufacturing an OLED display panel according to an embodiment of the present disclosure.

FIG. 7 is a schematic flowchart of a method for manufacturing an OLED display panel according to an embodiment of the present disclosure.

According to another aspect of the present disclosure, a method for manufacturing an OLED display panel is further provided. The method includes the following steps:

Step S10: Provide an OLED substrate, and form a first sub polarizing layer above the OLED substrate.

Step S20: Form a first packaging layer above the first sub polarizing layer.

Step S30: Form a second sub polarizing layer above the first packaging layer.

Step S40: Form a second packaging layer above the second sub polarizing layer.

Step S50: Form a protective layer above the second packaging layer.

In an embodiment, each of the first sub polarizing layer and the second sub polarizing layer includes an organic photosensitive layer and a dye molecule layer that are stacked.

In an embodiment, the first packaging layer and the second packaging layer are inorganic layers, and the protective layer is an organic layer.

The step S10 includes: providing an OLED substrate, forming the organic photosensitive layer on the OLED substrate, forming the dye molecule layer on a surface of the organic photosensitive layer, and performing a photo-alignment process to the organic photosensitive layer and the dye molecule layer, to form the first sub polarizing layer.

The organic layer, the organic photosensitive layer, and the dye molecule layer are all formed using a thin film technology.

In an embodiment, an OLED flexible display panel includes an OLED package structure. A first packaging layer, a second packaging layer, and an organic layer in the OLED package structure are formed using a thin film technology. The organic layer is formed using an ink-jet printing technology or a silk-screen printing technology. The first packaging layer and the second packaging layer may be formed using at least one of a pulsed laser deposition technology or an atomic layer deposition technology.

The organic photosensitive layer and the dye molecule layer are both organic compounds. Therefore, the organic photosensitive layer and the dye molecule layer may be formed using an organic thin film technology, and have good compatibility with a thin film process of the OLED package structure. In the present disclosure, in the OLED display panel, there is no process of attaching a circular polarizer. Therefore, processes of the OLED display panel can be reduced, thereby improving production efficiency of the OLED display panel. In addition, a thin film preparation technology can greatly reduce the thickness of the polarizing layer, and greatly widen application space of the OLED display panel.

In an embodiment, a specific step of the step S30 is similar to a specific step of the step S10. For a specific principle, refer to descriptions of the step S10, and details are not described herein again.

Figure 8:
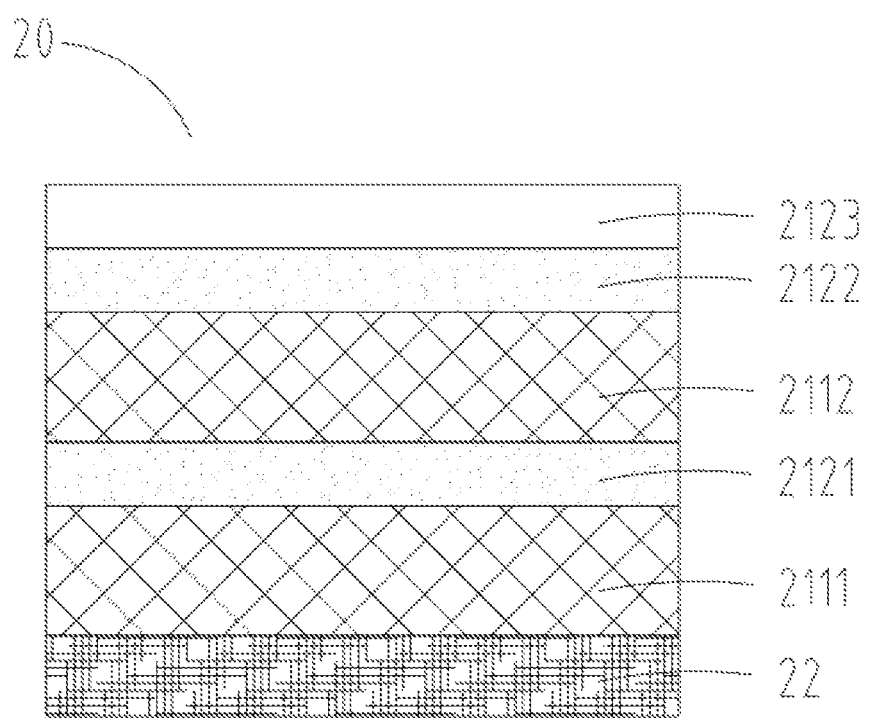
FIG. 8 is a schematic diagram of a structure of an OLED display panel according to an embodiment of the present disclosure.

FIG. 8 is a schematic diagram of a structure of an OLED display panel according to an embodiment of the present disclosure.

According to still another aspect of the present disclosure, an OLED display panel 2 is further provided. The OLED display panel 2 includes an OLED substrate 22, a packaging unit disposed on the OLED substrate 22, and a polarizing layer disposed in the packaging unit.

The packaging unit includes a first packaging layer 2121, a second packaging layer 2122, and a protective layer 2123.

The polarizing layer includes a first sub polarizing layer 2111 and a second sub polarizing layer 2112.

The first sub polarizing layer 2111 is disposed between the OLED substrate 22 and the first packaging layer 2121, and the second sub polarizing layer 2112 is disposed in the first packaging layer 2121.

The package structure in the OLED display panel and the OLED package structure have a same structure. For a working principle of the package structure in the OLED display panel, refer to a working principle of the OLED package structure, and details are not described herein again.

In the present disclosure, an OLED package structure having a polarizing property is designed, such that a polarizing layer is compatible with a packaging unit, and on the premise that a process of attaching a circular polarizer is omitted, manufacturing and attachment of the polarizing layer can be simplified, and the polarizing layer can be ultra-thin.

In conclusion, the present disclosure has been disclosed above through preferred embodiments. However, the preferred embodiments are not intended to limit the present disclosure, and a person of ordinary skill in the art can make various modifications and improvements without departing from the spirit and scope of the present disclosure. Therefore, the protection scope of the present disclosure should be subject to the scope defined by the claims.

What is claimed is:

1. An organic light-emitting diode (OLED) package structure, comprising a packaging unit and a polarizing layer disposed in the packaging unit, wherein
    the packaging unit comprises a first packaging layer, a second packaging layer, and a protective layer;
    the polarizing layer comprises a first sub polarizing layer and a second sub polarizing layer;
    the first sub polarizing layer is disposed between an OLED substrate and the first packaging layer, and the second sub polarizing layer is disposed between the first packaging layer and the second packaging layer;
    each of the first sub polarizing layer and the second sub polarizing layer comprises an organic photosensitive layer and a dye molecule layer that are stacked; and
    the first sub polarizing layer is opposite to and parallel to the second sub polarizing layer.

2. The OLED package structure as claimed in claim 1, wherein the organic photosensitive layer is formed using a photo-alignable organic material.

3. The OLED package structure as claimed in claim 1, wherein the dye molecule layer is formed using a dichroic dye molecule material.

4. The OLED package structure as claimed in claim 1, wherein the first sub polarizing layer is a ¼ wavelength phase retardation layer, and the second sub polarizing layer is a linear polarizing layer; and
    an angle between projection patterns of a transmission axis of the linear polarizing layer and a fast axis of the ¼ wavelength phase retardation layer on a same projection plane is 45°.

5. A method for manufacturing an organic light-emitting diode (OLED) display panel, comprising:
    step S10: providing an OLED substrate, and forming a first sub polarizing layer above the OLED substrate;
    step S20: forming a first packaging layer above the first sub polarizing layer;
    step S30: forming a second sub polarizing layer above the first packaging layer;
    step S40: forming a second packaging layer above the second sub polarizing layer; and
    step S50: forming a protective layer above the second packaging layer, wherein
    each of the first sub polarizing layer and the second sub polarizing layer comprises an organic photosensitive layer and a dye molecule layer that are stacked;
    the first packaging layer and the second packaging layer are inorganic layers, and the protective layer is an organic layer; and
    wherein the first sub polarizing layer is opposite to and parallel to the second sub polarizing layer.

6. The method for manufacturing an OLED display panel as claimed in claim 5, wherein the step S10 comprises: providing an OLED substrate, forming the organic photosensitive layer on the OLED substrate, forming the dye molecule layer on a surface of the organic photosensitive layer, and performing a photo-alignment process to the organic photosensitive layer and the dye molecule layer, to form the first sub polarizing layer.

7. The method for manufacturing an OLED display panel as claimed in claim 6, wherein the organic layer, the organic photosensitive layer, and the dye molecule layer are all formed using a thin film technology.

8. The method for manufacturing an OLED display panel as claimed in claim 5, wherein the organic photosensitive layer is formed using a photo-alignable organic material.

9. The method for manufacturing an OLED display panel as claimed in claim 5, wherein the dye molecule layer is formed using a dichroic dye molecule material.

10. The method for manufacturing an OLED display panel as claimed in claim 5, wherein the first sub polarizing layer is a ¼ wavelength phase retardation layer, and the second sub polarizing layer is a linear polarizing layer; and
    an angle between projection patterns of a transmission axis of the linear polarizing layer and a fast axis of the ¼ wavelength phase retardation layer on a same projection plane is 45°.

11. The method for manufacturing an OLED display panel as claimed in claim 5, wherein the OLED display panel further comprises at least one composite layer, and the composite layer comprises an organic layer and an inorganic layer that are stacked; and the composite layer is disposed between the OLED substrate and the protective layer.

12. An organic light-emitting diode (OLED) display panel, comprising an OLED substrate, a packaging unit disposed on the OLED substrate, and a polarizing layer disposed in the packaging unit, wherein the packaging unit comprises a first packaging layer, a second packaging layer, and a protective layer;

the polarizing layer comprises a first sub polarizing layer and a second sub polarizing layer;

the first sub polarizing layer is disposed between the OLED substrate and the first packaging layer, and the second sub polarizing layer is disposed between the first packaging layer and the second packaging layer;

the first sub polarizing layer is opposite to and parallel to the second sub polarizing layer; and each of the first sub polarizing layer and the second sub polarizing layer comprises an organic photosensitive layer and a dye molecule layer that are stacked.

13. The OLED display panel as claimed in claim 12, wherein the organic photosensitive layer is formed using a photo-alignable organic material.

14. The OLED display panel as claimed in claim 12, wherein the dye molecule layer is formed using a dichroic dye molecule material.

15. The OLED display panel as claimed in claim 12, wherein the first sub polarizing layer is a ¼ wavelength phase retardation layer, and the second sub polarizing layer is a linear polarizing layer; and an angle between projection patterns of a transmission axis of the linear polarizing layer and a fast axis of the ¼ wavelength phase retardation layer on a same projection plane is 45°.

16. The OLED display panel as claimed in claim 12, wherein the OLED display panel further comprises at least one composite layer, and the composite layer comprises an organic layer and an inorganic layer that are stacked; and the composite layer is disposed between the OLED substrate and the protective layer.

* * * * *

UNITED STATES PATENT AND TRADEMARK OFFICE
CERTIFICATE OF CORRECTION

| | |
|---|---|
| PATENT NO. | : 10,930,878 B2 |
| APPLICATION NO. | : 16/339010 |
| DATED | : February 23, 2021 |
| INVENTOR(S) | : Qi Yang |

It is certified that error appears in the above-identified patent and that said Letters Patent is hereby corrected as shown below:

On the Title Page

Insert the following:
--(30) *Foreign Application Priority Data*
Jul. 5, 2018 (CN).......................... 201810729087.4--

Signed and Sealed this
Eleventh Day of May, 2021

Drew Hirshfeld
*Performing the Functions and Duties of the
Under Secretary of Commerce for Intellectual Property and
Director of the United States Patent and Trademark Office*